United States Patent
Propp et al.

(10) Patent No.: US 7,233,637 B2
(45) Date of Patent: Jun. 19, 2007

(54) WIDEBAND COMMUNICATION USING DELAY LINE CLOCK MULTIPLIER

(75) Inventors: Michael Propp, Brookline, MA (US); John Jakson, Marlborough, MA (US)

(73) Assignee: Adaptive Networks, Inc., Needham, MA (US)

(*) Notice: Subject to any disclaimer, the term of this patent is extended or adjusted under 35 U.S.C. 154(b) by 728 days.

(21) Appl. No.: 09/837,760

(22) Filed: Apr. 17, 2001

(65) Prior Publication Data

US 2002/0015461 A1     Feb. 7, 2002

Related U.S. Application Data

(60) Provisional application No. 60/198,147, filed on Apr. 17, 2000.

(51) Int. Cl.
   *H03D 3/24* (2006.01)
(52) U.S. Cl. .................................................. 375/373
(58) Field of Classification Search ............... 375/371, 375/372, 373; 327/152, 153, 158, 161
See application file for complete search history.

(56) References Cited

U.S. PATENT DOCUMENTS

| | | | | |
|---|---|---|---|---|
| 5,796,313 A | * | 8/1998 | Eitan | 331/57 |
| 5,926,053 A | * | 7/1999 | McDermott et al. | 327/298 |
| 6,275,547 B1 | * | 8/2001 | Saeki | 375/354 |
| 6,404,833 B1 | * | 6/2002 | Takebe | 375/371 |
| 6,650,661 B1 | * | 11/2003 | Buchanan et al. | 370/516 |
| 6,674,824 B1 | * | 1/2004 | Chiueh et al. | 375/376 |
| 6,721,379 B1 | * | 4/2004 | Cranford et al. | 375/376 |

* cited by examiner

*Primary Examiner*—Khanh Tran
*Assistant Examiner*—Sam K. Ahn
(74) *Attorney, Agent, or Firm*—Fish & Richardson P.C.

(57) ABSTRACT

A delay line clock multiplier is disclosed for use in a communication system, in which a delay line is used as a clock multiplier for generating a higher speed clock that may be used, for example, for data sampling. The speed and timing characteristics of the clock delay line are adjusted by controlling the supply voltage to the delay line. because proper synchronization may be achieved at the higher frequencies using an oversampling synchronization approach which in turn is made possible by the delay line clock multiplier which allows for the oversampling of a signal at sub-interval increments.

14 Claims, 3 Drawing Sheets

WIDEBAND COMMUNICATION USING DELAY LINE CLOCK MULTIPLIER

This patent application claims the priority of U.S. Provisional Patent Application No. 60/198,147, filed Apr. 17, 2000 the entirety of which is incorporated herein by reference.

FIELD OF THE INVENTION

The present invention relates generally to the field of data communications. Specifically, the present invention relates to a data sampling system which may be used in for example synchronization procedures such as those used in wideband spread spectrum communication.

BACKGROUND OF THE INVENTION

Spread spectrum communication is a type of signal modulation in which a signal to be transmitted is spread over a bandwidth that substantially exceeds the data transfer rate or the minimum bandwidth required to transmit the signal. Fundamentally, in channels with narrowband noise, increasing the transmitted signal bandwidth decreases the interference effect of such noise since the signal instead of being concentrated in a particular band is now spread out over a much wider band.

Signal spreading may be achieved using any of a number of different techniques, including direct sequence, frequency hopping or a hybrid combination. In direct sequence spread spectrum, a periodic, relatively high frequency, repetitive pseudo-noise code (PN) is mixed with the data signal using XOR gates or a mixer, and the resulting signal is then modulated using, e.g., binary phase shift keying (BPSK) or quadrature phase shift keying (QPSK). This process causes the transmitted signal to be replaced by a very wide bandwidth signal with the spectral equivalent of a noise signal. At the receiver, the demodulation process involves the mixing and multiplying of the same PN code with the received signal. This produces a correlated signal which is maximum when the PN code matches the received signal. The correlated signal is then filtered and demodulated.

In frequency hopping spread spectrum, the signal stream to be transmitted is shifted in frequency by an amount determined by a code that spreads the signal power over a wide bandwidth. This is accomplished using a PN code controlled frequency synthesizer. In this way, the instantaneous frequency output of the transmitter jumps from one value to another based on the PN code. By changing the instantaneous frequency of the output signal, the output frequency spectrum is effectively spread over the range of the wider bandwidth.

The PN codes used in direct sequence spread spectrum systems consist of individual units called "chips" which can have two values, either −1/1 in a polar system or 0/1 in a binary system. In general, these PN codes must have a sharp (e.g., one chip wide) autocorrelation peak to allow for proper code synchronization, as well as a low cross-correlation value to allow for more users in the system. Additionally, the codes should be balanced, i.e., the number of ones and zeros may only differ by a maximum of one. This latter requirement allows for good spectral density such that the signal energy may be uniformly spread over the entire frequency band. Codes which may be used in direct sequence spread spectrum systems include Walsh-Hadamard codes, M-sequences, Gold codes and Kasami codes. These codes may be either orthogonal or non-orthogonal.

One difficulty encountered in spread spectrum systems is achieving proper synchronization, i.e., having the receiver lock onto and synchronize with the bit timing of the transmitter so that the receiver is sampling and segmenting the received signal at the proper bit boundaries intended by the transmitter. One approach to achieving synchronization is disclosed in U.S. Pat. No. 5,727,004 entitled METHOD AND APPARATUS FOR DATA ENCODING AND COMMUNICATION OVER NOISY MEDIA, and assigned to the assignee of the present application, the contents of which are incorporated herein by reference. The synchronization procedure disclosed in U.S. Pat. No. 5,727,004 eoversamples the received signal at a number of points which are offset in time by a fraction of the bit interval (i.e., sub-interval). Each of the sampled signals is analyzed to determine which of the bit intervals results in good correlation and therefore represents the proper bit boundaries. The oversampling of the incoming signal at a number of sub-intervals generally requires either a clock or some other timing source running at a multiple of the bit clock in order to sample the signal at subinterval increments.

The FCC regulations governing electromagnetic radiation limits, 47 CFR § 15.107, 109, 209, . . . place limits on radiated and conducted emissions for both intended and unintended emissions. The term "intended" refers to the intended mode of transmission. For example, in the case of wireless communication, the "intended" mode of transmission is radiated, while the unintended mode of transmission is conducted. Similarly, in the case of wired communication, the "intended" mode of transmission is conducted, while the unintended mode of transmission is radiated.

SUMMARY OF THE INVENTION

The present invention is directed to a delay line clock multiplier for use in a communication system, such as a spread spectrum system, in which a delay line is used as a clock multiplier for generating a higher speed clock that may be used, for example, for data sampling. The speed and timing characteristics of the clock delay line are adjusted by controlling the supply voltage to the delay line. Additionally, by utilizing the spread spectrum approach, the electromagnetic emissions can be kept below the FCC imposed limits. Generally, as a signal is spread over a wider spectrum utilizing higher frequencies there results a problem in achieving proper synchronization at those higher frequencies. However, utilizing the present invention, a signal may be spread over a wide frequency band because proper synchronization may be achieved at the higher frequencies using an oversampling synchronization approach which in turn is made possible by the delay line clock multiplier which allows for the oversampling of a signal at sub-interval increments.

According to the present invention, a multiple stage delay line is used as a clock multiplier for generating a high speed clock signal from a relatively low speed clock source. The delay line includes an odd number of delay stages and the output of the last delay stage is connected to the input of the first delay stage in essentially an oscillator or inverter ring configuration. Normally, an inverter ring contains alternating 1s and 0s in the successive stages of the ring. However, the inverter ring of the present invention is perturbed or initialized to contain the same value in two successive stages (e.g. two 1s or two 0s in a row) in order to create a distinctive transition or edge pattern which cycles through the ring.

The contents of the delay line, i.e., the state of the delay line at a particular stage, which is essentially a square wave with alternating 1s and 0s is input to a phase comparator. The other input to the phase comparator is connected to the slow speed clock signal. The output of the phase comparator is an indication of the relative speeds of the two input signals, viz., the slow speed clock and the delay line contents, and is used to control a voltage adjustment circuit which in turn adjusts one or both of the supply voltages to the delay line to thereby adjust the switching speed of the individual gates or stages that make up the delay line.

Essentially, the phase comparator and voltage adjustment circuit act to speed up or slow down the delay line to match the slow speed clock signal. If the delay line is running too slow, the supply voltages are adjusted to decrease the voltage difference between them. As a result, the individual gates of the delay line switch a smaller voltage difference in going from high to low (or low to high) and are thus able to switch faster. Conversely, if the delay line is running too fast, the supply voltages are increased so as to increase the voltage difference between them. This slows down the individual gate elements which must now switch a larger voltage difference for each high to low (or low to high) transition. It should be noted that when the delay line and the slow speed clock are properly matched, the speed of the delay line (i.e., the delay through all the stages of the delay line) is actually twice that of the slow speed clock, since each stage in the delay line must include two periods (high and low) to match the square wave slow speed clock signal. The delay through all the stages of the delay line corresponds to one phase of the slow speed clock signal so the delay through the delay line is less than the period of the slow speed clock signal.

Once the clock delay line is running at the appropriate speed, this in turn establishes the corresponding control voltages which result in that speed. The control voltages are also applied to another delay line (series connected inverters) which is essentially used as a serial shift register causing it in turn to run at the same speed as the first delay line. The input to the second delay line is the serial stream of incoming data, and the individual stages of the second delay line act to oversample the incoming data at a number of successive subintervals. Each of the subinterval samples is latched for subsequent processing and compensated for the inversion of the individual stages introduced by the inverter. In this way, adjusting the control voltage acts to adjust the timing of the delay lines in order to oversample the incoming data signal in order to achieve proper synchronization.

BRIEF DESCRIPTION OF THE DRAWINGS

Other objects, features and advantages of the invention discussed in the above brief explanation will be more clearly understood when taken together with the following detailed description of an embodiment which will be understood as being illustrative only, and the accompanying drawings reflecting aspects of that embodiment, in which.

DETAILED DESCRIPTION OF THE PREFERRED EMBODIMENTS

Figure 1:
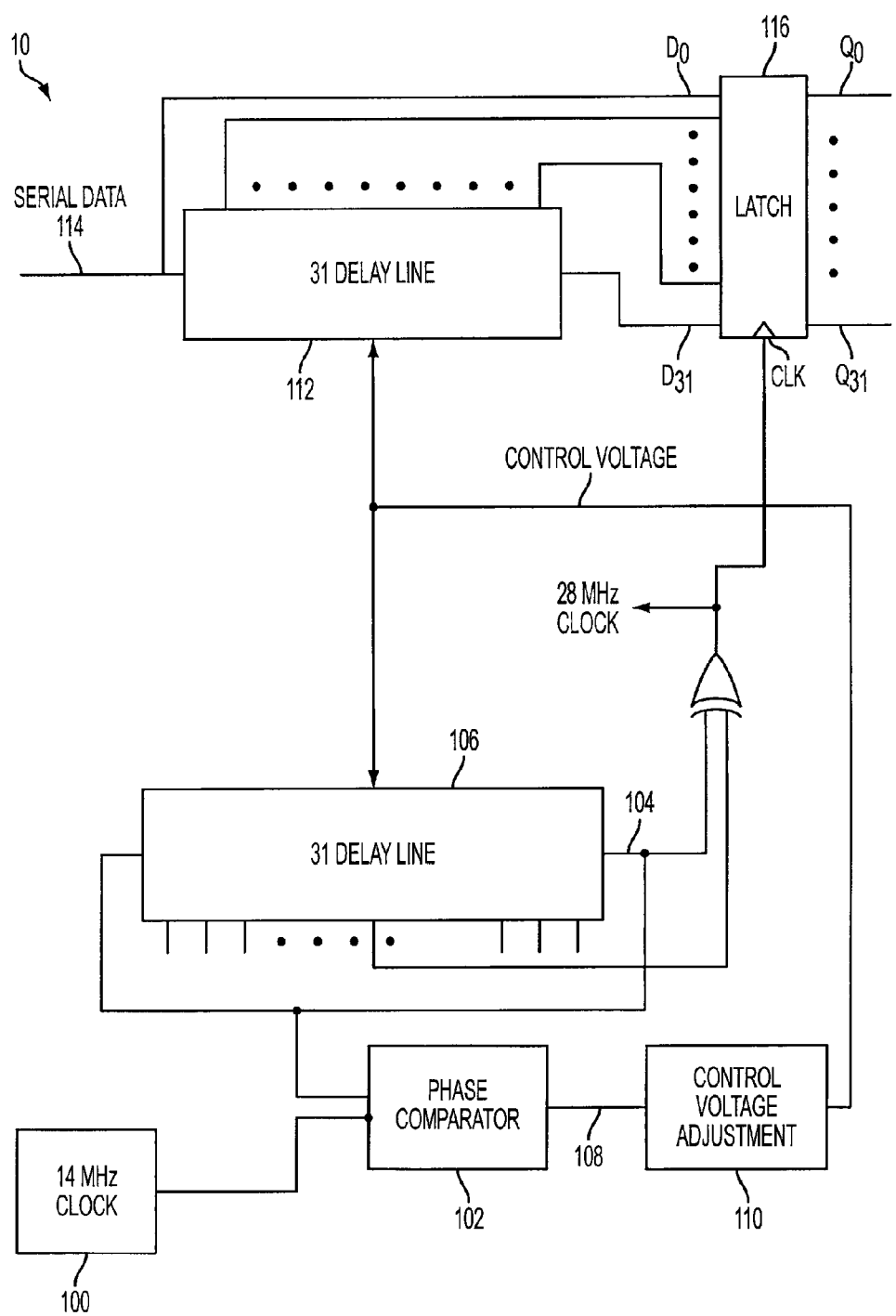
FIG. 1 is a block diagram of a delay line clock multiplier oversampling circuit according to the present invention.

Referring now to FIG. 1, therein is shown a block diagram of a delay line clock multiplier oversampling circuit 10 according to the present invention. The clock multiplier circuit 10 includes a clock source 100 which is also referred to herein as a slow speed clock source since the clock and timing signals generated by the clock multiplier circuit 10 result in a faster speed clock signal than that of clock source 100. In the specific example illustrated in FIG. 1 and described herein, clock source 100 is a 14 MHZ clock; however, it should be understood that the speed of clock source may of course be varied to other frequencies depending on the particular application.

The output of clock source 100 is applied as an input to phase comparator 102. The other input to phase comparator 102 is connected to the output stage 104 of a delay line 106. The operation of delay line 106 will be described in greater detail below. The function of phase comparator 102 is to produce an output signal on line 108 which is an indication of the relative speeds or phases of the two input signals to the phase comparator 102. The phase comparator output signal is provided to a control voltage adjustment circuit 110 that, depending on the output signal from the phase comparator 102, adjusts the power supply or reference voltages applied to delay line 106.

Figure 3:
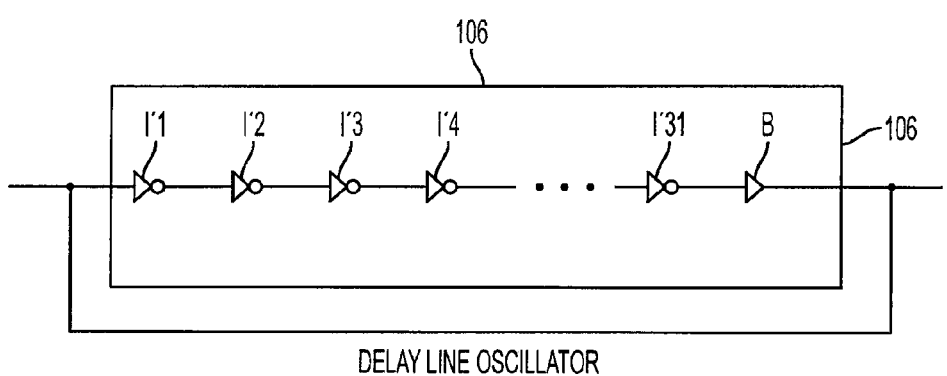
FIG. 3 is a schematic diagram of a delay line configured as an oscillator.
Figure 4:
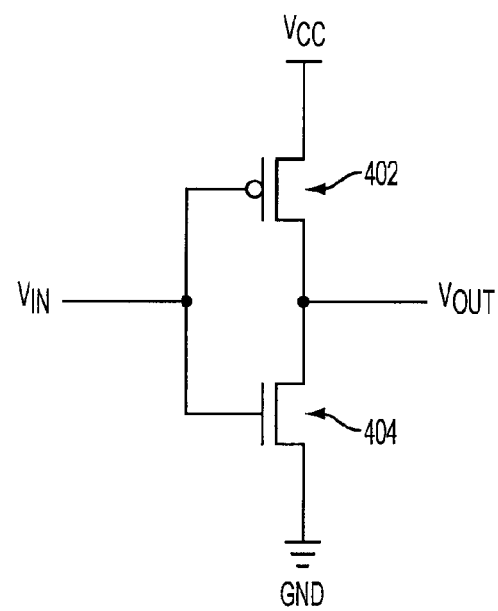
FIG. 4 is a schematic diagram of an inverter stage.

Essentially, control voltage adjustment circuit 110 is responsive to the output signal from the phase comparator 102 to either increase or decrease one or more of the power supply voltages supplied to the delay line 106 in order to slow down or speed up the switching operation of delay line 106. As shown in FIG. 3, in one illustrative embodiment the delay line 106 consists of a number of series connected inverters I'1, I'2, . . . followed by a buffer B. Thus, the delay line functions as an oscillator. In the specific embodiment illustrated in FIG. 3, delay line 106 includes 31 inverter stages followed by the buffer B. Further, the output of the buffer B is connected to the input of the first inverter I'1 in order to provide an inverter ring or oscillator. Each of the inverters in delay line 106 is constructed generally according to the circuit diagram of FIG. 4. As shown in FIG. 4, each inverter stage includes a P-channel transistor 402 connected to an N-channel transistor 404. The gate inputs to the transistors 402 and 404 are connected together and act as the input node $V_{IN}$, while the drains of the two transistors are likewise connected together and act as the output node $V_{OUT}$.

Figure 5:
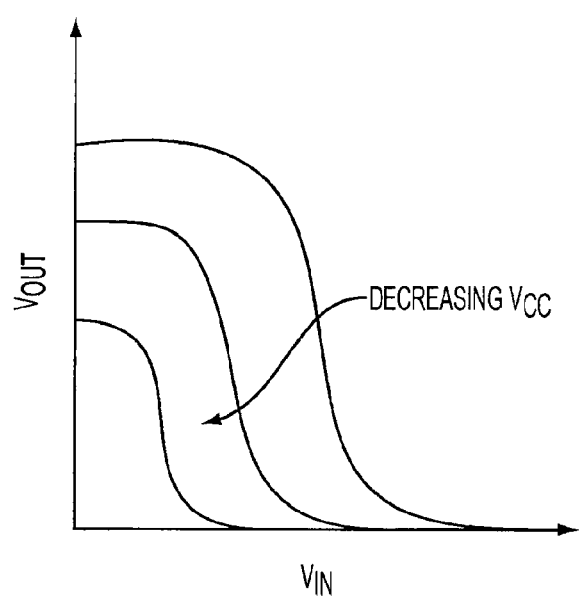
FIG. 5 is an illustration of the voltage transfer characteristics of an inverter stage.

The circuit configuration of FIG. 4 acts as an inverter, i.e., a logic high input (1) results in a logic low output (0) and vice versa. The voltage transfer characteristics of the circuit of FIG. 4 are illustrated in FIG. 5 as a function of supply voltage $V_{CC}$. As shown in FIG. 5, as the supply voltage $V_{CC}$ decreases, the switching speed of the inverter increases since the voltage swing between the logic levels decreases. The control voltage adjustment circuit 110 acts to adjust the supply voltage $V_{CC}$ in order to adjust the switching speed of the individual inverter stages of delay line 106. The circuits such as are shown in FIG. 4 have two supply voltages $V_{CC}$ and GND, with the effective voltage supplied to the circuit being the differential voltage between the two supplies, i.e., $V_{CC}$–GND. The object of control voltage adjustment circuit 110 is to adjust this differential voltage, which of course may be achieved by modifying one or both of $V_{CC}$ and GND.

Phase comparator 102 and control voltage adjustment circuit 110 operate to adjust the supply voltage $V_{CC}$ and, thus, the speed of delay line 106 so that the delay time through the 32 stages (31 inverters I'N and buffer B) of delay line 106 is the same as the slow speed clock signal generated by the clock 100.

Figure 2:
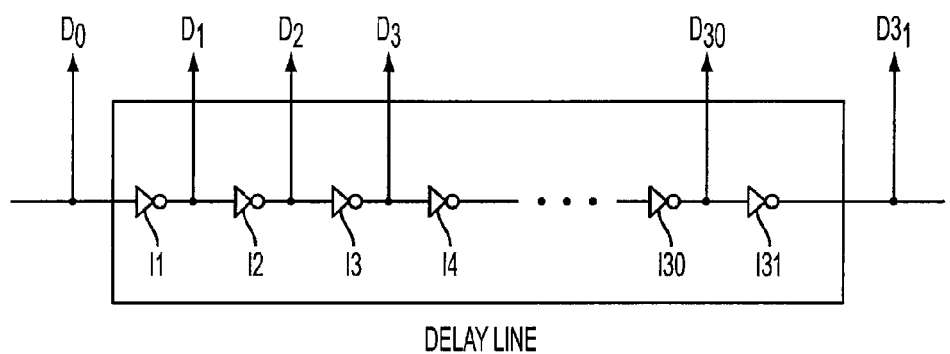
FIG. 2 is a schematic diagram of a delay line configured as a sampling shift register.

The adjusted supply voltage $V_{CC}$ from the control voltage adjustment circuit 110 is also applied to a second delay line 112 (FIGS. 1 and 2). In the illustrative embodiment of FIGS. 1 and 2, the second delay line 112 includes thirty one (31) series-connected inverters I1 through I31. The input of the first inverter I1 is connected to the incoming signal line 114 that transmits the serial data being received. A plurality of output lines $D_0$ through $D_{31}$ are connected to the second delay line 112 and to a latch 116. The line $D_0$ is connected to the input of inverter I1, while the lines $D_1$ through $D_{31}$ are connected to the outputs of the respective inverters I1 through I31.

The latch 116 is triggered by the output from the delay line 106. In the illustrative embodiment, because the clock source 100 operates at 14 MHZ, the output from the delay line serves as a 28 MHZ clock. Thus, the latch operates at the increased frequency, such that the serial data is oversampled. Each bit is sampled 32 times.

Thus, by adjusting the phase of the delay line 106 through the control voltage adjustment circuit 110, the circuit 10 of the present invention is controlled to oversample the serial data signal in order to achieve proper synchronization.

From the foregoing, it will be apparent that the system 10 of the present invention serves to oversample an incoming serial data stream in order to achieve proper synchronization between the receiver and transmitter.

While a form of the invention has been illustrated and described, it will be apparent to those skilled in the art that various modifications and improvements may be made without departing from the spirit and scope of the invention.

What is claimed is:

1. A circuit comprising:
    a first delay device including a control input and at least one output;
    a second delay device including a control input and at least one output;
    a control signal line coupled to, and configured to provide a control signal to, the control input of the first delay device and the second delay device, the control signal being based on the at least one output of the first delay device and on a clock;
    a sampling signal line coupled to, and configured to provide a sampling signal based on the at least one output of the first delay device; and
    a sampling device coupled to the at least one output of the second delay device and coupled to the sampling signal line, the sampling device configured to sample the at least one output of the second delay device based on a value of the sampling signal,
    wherein the second delay device includes multiple outputs, and the sampling device is coupled to the multiple outputs,
    wherein the first delay device comprises a first delay line,
    wherein the first delay line includes cascaded inverters, and
    wherein the cascaded inverters are arranged in a feedback configuration and at least two consecutive inverters are configured with common initial conditions so as to produce a distinctive pattern during operation of the first delay line.

2. The circuit of claim 1 further comprising a comparator that includes a first input coupled to the at least one output of the first delay device, a second input coupled to the clock, and an output coupled to the control signal line.

3. The circuit of claim 2 wherein the comparator is configured to provide on the output an error signal between the at least one output of the first delay device and the clock.

4. The circuit of claim 3 further comprising a voltage adjustment device disposed between the output of the comparator and the control signal line, and configured to provide the control signal on the control signal line based on the error signal.

5. The circuit of claim 1 wherein the sampling device comprises a latch configured to sample the multiple outputs of the second delay device together based on the value of the sampling signal.

6. The circuit of claim 1 wherein the sampling device comprises a latch.

7. The circuit of claim 1 wherein the second delay device comprises a second delay line.

8. The circuit of claim 7 wherein the second delay line comprises an input configured to be coupled to a data source and is configured to hold data representing one bit of the data source.

9. The circuit of claim 8 wherein the sampling device is configured to sample the data with multiple samples such that each bit is sampled multiple times.

10. The circuit of claim 1 wherein the cascaded inverters include an odd number of inverters.

11. The circuit of claim 1 wherein the second delay device comprises an input configured to be coupled to a data source.

12. A circuit comprising:
    a first delay device including a control input and at least one output;
    a second delay device including a control input and at least one output;
    a control signal line coupled to, and configured to provide a control signal to, the control input of the first delay device and the second delay device, the control signal being based on the at least one output of the first delay device and on a clock;
    a sampling signal line coupled to, and configured to provide a sampling signal based on the at least one output of the first delay device; and
    a sampling device coupled to the at least one output of the second delay device and coupled to the sampling signal line, the sampling device configured to sample the at least one output of the second delay device based on a value of the sampling signal,
    wherein the second delay device includes multiple outputs, and the sampling device is coupled to the multiple outputs,
    wherein the first delay device comprises a first delay line,
    wherein the first delay line includes cascaded inverters, and
    wherein the control input of the first delay line comprises a supply voltage input, and a level of supply voltage on the supply voltage input affects switching speed of the cascaded inverters.

13. A circuit comprising:
    a first delay line including an odd number of cascaded inverters, a supply voltage input, and at least one output, the cascaded inverters being arranged in a feedback configuration and at least two consecutive inverters being configured with common initial conditions so as to produce a distinctive pattern during operation of the first delay line, wherein a level of supply voltage on the supply voltage input affects switching speed of the cascaded inverters;

a second delay line including an input configured to be coupled to a data source, multiple outputs, and a control input;

a comparator including a first input coupled to the at least one output of the first delay line, a second input coupled to a clock, and at least one output, the comparator being configured to provide on the at least one output an error signal between the output of the first delay line and the clock;

a control signal line coupled to the at least one output of the comparator, the supply voltage input of the first delay line, and the control input of the second delay line, the control signal line being configured to provide a control signal, based on the error signal, to the supply voltage input of the first delay line and the control input of the second delay line;

a sampling signal line coupled to, and configured to provide a sampling signal based on, the at least one output of the first delay line; and a sampling device coupled to the multiple outputs of the second delay line and coupled to the sampling signal line, the sampling device configured to sample the multiple outputs of the second delay line based on a value of the sampling signal.

14. The circuit of claim 13 wherein:

the second delay line comprises an odd number of cascaded inverters, the control input of the second delay line comprises a supply voltage input, and a level of supply voltage on the supply voltage input of the second delay line affects switching speed of the cascaded inverters of the second delay line.

* * * * *